United States Patent
Cattani et al.

(10) Patent No.: US 11,387,735 B2
(45) Date of Patent: Jul. 12, 2022

(54) HALF-BRIDGE CIRCUIT WITH SLEW RATE CONTROL

(71) Applicant: STMicroelectronics S.r.l., Agrate Brianza (IT)

(72) Inventors: Alberto Cattani, Cislago (IT); Alessandro Gasparini, Cusano Milanino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 40 days.

(21) Appl. No.: 17/117,847

(22) Filed: Dec. 10, 2020

(65) Prior Publication Data

US 2021/0184576 A1 Jun. 17, 2021

(30) Foreign Application Priority Data

Dec. 12, 2019 (IT) .......................... 102019000023787

(51) Int. Cl.
*H02M 3/158* (2006.01)
*H02M 1/08* (2006.01)
(Continued)

(52) U.S. Cl.
CPC ....... *H02M 3/1582* (2013.01); *H02M 1/0029* (2021.05); *H02M 1/08* (2013.01);
(Continued)

(58) Field of Classification Search
CPC .... H02M 3/1582; H02M 1/0029; H02M 1/08; H02M 3/158; H02M 1/0006;
(Continued)

(56) References Cited

U.S. PATENT DOCUMENTS 6,025,705 A * 2/2000 Nguyen ............... H02M 3/1588
                                                         363/17
6,384,687 B1 * 5/2002 Maida ................. H03F 3/45506
                                                         330/296
(Continued)

FOREIGN PATENT DOCUMENTS

CN          207010539 U     2/2018
JP          2014023269 A    2/2014

OTHER PUBLICATIONS

Fairchild: "AN-6076 Design and Application Guide of Bootstrap Circuit for High-Voltage Gate-Drive IC", Dec. 30, 2008, XP055715144.
(Continued)

*Primary Examiner* — Yusef A Ahmed
(74) *Attorney, Agent, or Firm* — Crowe & Dunlevy (57) ABSTRACT

First and second n-channel FETs are connected in series between first and second terminals with an intermediate switching node. First and second driver circuits drive gates of the first and second n-channel FETs, respectively, in response to drive signals. The first driver circuit does not implement slew-rate control. A first resistor and capacitor are connected in series between the output of the first driver circuit and an intermediate node. A first electronic switch is connected between the intermediate node and the first terminal. A second electronic switch is connected between the intermediate node and the gate terminal of the first n-channel FET. A second resistor and a third electronic switch are connected in series between the gate terminal of the first n-channel FET and the switching node. A control circuit generates the drive signals and a first, second and third control signal for the first, second and third electronic switch.

12 Claims, 8 Drawing Sheets

(51) Int. Cl.
H03K 17/06 (2006.01)
H02M 1/00 (2006.01)

(52) U.S. Cl.
CPC .......... H02M 3/158 (2013.01); H03K 17/063 (2013.01); *H02M 1/0006* (2021.05); *H02M 1/0032* (2021.05); *H03K 2217/0063* (2013.01); *H03K 2217/0072* (2013.01); *H03K 2217/0081* (2013.01)

(58) Field of Classification Search
CPC .... H02M 1/0032; H02M 1/44; H03K 17/063; H03K 2217/0063; H03K 2217/0072; H03K 2217/0081; H03K 17/166; Y02B 70/10
See application file for complete search history.

(56) References Cited

U.S. PATENT DOCUMENTS

| | | | |
|---|---|---|---|
| 6,812,782 B2* | 11/2004 | Grant | H02M 1/08 323/288 |
| 7,019,551 B1* | 3/2006 | Biesterfeldt | H03K 17/163 326/29 |
| 7,872,456 B2* | 1/2011 | Li | H02M 3/1588 323/283 |
| 8,558,586 B1 | 10/2013 | Martin et al. | |
| 8,643,419 B2* | 2/2014 | Rueger | H03F 3/2171 327/170 |
| 9,929,652 B1 | 3/2018 | Ribarich et al. | |
| 10,554,204 B1* | 2/2020 | Young | H03K 17/165 |
| 10,615,779 B1* | 4/2020 | Butenhoff | H03K 5/24 |
| 10,763,843 B2* | 9/2020 | Shankar | H03K 17/063 |
| 2002/0113634 A1* | 8/2002 | Spurlin | H03K 17/166 327/170 |
| 2007/0046275 A1* | 3/2007 | Shirai | H03K 17/165 323/284 |
| 2008/0088283 A1* | 4/2008 | Ruobiao | H02M 3/1588 323/285 |
| 2012/0043950 A1* | 2/2012 | Truong | H02M 3/158 323/282 |
| 2013/0113524 A1* | 5/2013 | Rueger | H03F 3/3022 327/108 |
| 2014/0203846 A1* | 7/2014 | Janschitz | H03K 17/166 327/109 |
| 2014/0217959 A1* | 8/2014 | Chen | H02J 7/00 323/311 |
| 2015/0188328 A1* | 7/2015 | Abouda | H03K 17/162 123/478 |
| 2016/0094210 A1* | 3/2016 | Poletto | H03K 17/166 327/108 |
| 2016/0118894 A1* | 4/2016 | Zhang | H02M 1/08 323/271 |
| 2016/0301401 A1* | 10/2016 | Won | H03K 17/74 |
| 2017/0012618 A1* | 1/2017 | Krishna | H03K 7/08 |
| 2017/0033677 A1* | 2/2017 | Wu | H02M 1/08 |
| 2017/0250609 A1* | 8/2017 | Zhang | H02M 3/158 |
| 2017/0302178 A1* | 10/2017 | Bandyopadhyay | H03F 3/2171 |
| 2018/0294719 A1* | 10/2018 | Khatib | H02M 1/084 |
| 2019/0238129 A1* | 8/2019 | Fukushima | H02M 1/08 |
| 2019/0245534 A1* | 8/2019 | Takayama | H03K 17/162 |
| 2020/0225687 A1* | 7/2020 | Ichikawa | H03K 17/567 |
| 2020/0381989 A1* | 12/2020 | Kuang | H03K 19/01714 |
| 2021/0013808 A1* | 1/2021 | Cattani | H03K 17/6871 |
| 2021/0126538 A1* | 4/2021 | Puia | H02M 1/08 |
| 2021/0159775 A1* | 5/2021 | O Malley | H02M 3/155 |
| 2021/0313980 A1* | 10/2021 | Zhou | H03K 17/102 |

OTHER PUBLICATIONS

IT Search Report and Written Opinion for IT Appl. No. 102019000023787 dated Jul. 15, 2020 (9 pages).

\* cited by examiner

HALF-BRIDGE CIRCUIT WITH SLEW RATE CONTROL

PRIORITY CLAIM

This application claims the priority benefit of Italian Application for Patent No. 102019000023787, filed on Dec. 12, 2019, the content of which is hereby incorporated by reference in its entirety to the maximum extent allowable by law.

TECHNICAL FIELD

The embodiments of the present description refer a half-bridge driver circuit. Embodiments of the present description may be used to drive a half-bridge circuit of an inverting buck-boost converter.

BACKGROUND

Electronic converters, such as AC/DC or DC/DC switched mode power supplies, for example, are well known in the art. There exist many types of electronic converters that may be divided mainly into isolated and non-isolated converters. For example, non-isolated electronic converters are converters of the buck, boost, buck-boost, Cuk, SEPIC, and ZETA types. Instead, isolated converters comprise a transformer, such as flyback and forward converters. These types of converters are well known to the person skilled in the art.

Such electronic converters are commonly used in a lot of applications to generate appropriate voltages required by complex systems to work and to guarantee requested performance. Many of these systems have a particular focus on efficiency and power consumption in order to reach a longer operating life in case of a battery equipped system. In such applications, where often a lot of electronic chips and circuits are installed in a very small space, it is often very important to have the possibility to control and limit electro-magnetic interference (EMI) that a circuit produces and that can induce problems to the other circuits, in particular to antennas and radio-transmitters.

In order to have the possibility to manage EMI in electronic converters, it is often required to control the slew-rate of the high-frequency switching nodes. These nodes are the main contributor to EMI emission and, by controlling their slew-rate, is possible to mitigate their effect and in particular reduce their emission with a slower slew-rate. For example, when using Field Effect Transistors (FET), such as Metal-Oxide-Semiconductor Field-Effect Transistors (MOSFET), for the electronic switches associated with the switching nodes of the electronic converter, such a slew rate control may be implemented in the driver circuit(s) for such FET. For example, in this context may be cited document United States Patent Publication No. 2017/0222638 A1, which is incorporated herein by reference for this purpose.

Figure 1:
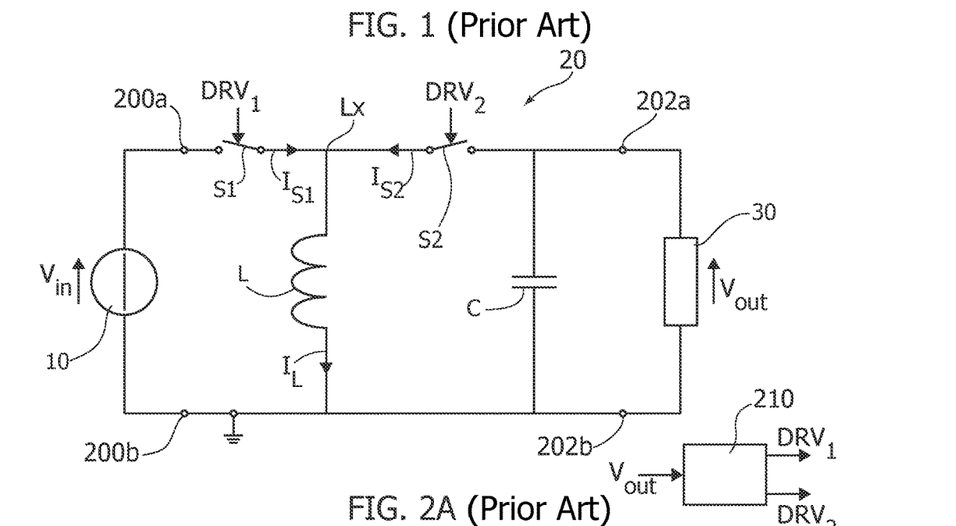
FIG. 1 shows an example of an inverting buck-boost converter.

For example, FIG. 1 shows an example of an inverting buck-boost converter 20. In the example considered, the electronic converter 20 comprises a first and a second input terminal 200a and 200b for receiving a DC input voltage $V_{in}$ and a first and a second output terminal 202a and 202b for providing a DC output voltage $V_{out}$. For example, the input voltage $V_{in}$ may be provided by a DC voltage source 10, such as a battery. Generally, the DC input voltage $V_{in}$ may also be generated via a rectifier circuit from an AC voltage. Conversely, the output voltage $V_{out}$ may be used to supply an electric load 30.

In the example considered, two electronic switches S1 and S2 are connected (e.g., directly) in series between the terminals 200a and 202a. Moreover, an intermediate point Lx between the two electronic switches is connected (e.g., directly) via an inductor L to the terminal 200b, which usually is connected (e.g., directly) to the terminal 202b. The terminal 200b represent thus a reference voltage, which is usually ground.

Often an inverting buck-boost converter comprises also a capacitor C connected (e.g., directly) between the terminals 202a and 202b.

Typically, the switches S1 and S2 are driven via a control circuit 210 which generates respective drive signals $DRV_1$ and $DRV_2$ for the switches S1 and S2.

Figure 2A:
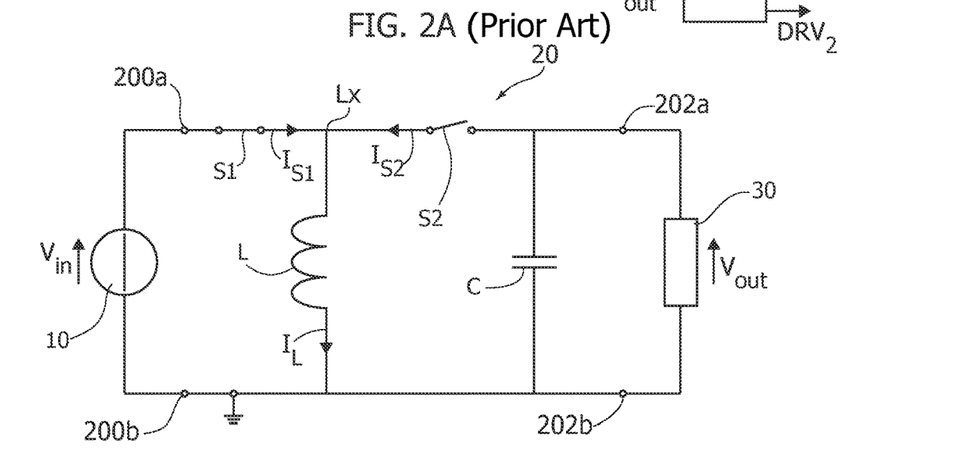
FIGS. 2A and 2B show typical switching states of the converter of FIG. 1.
Figure 2B:
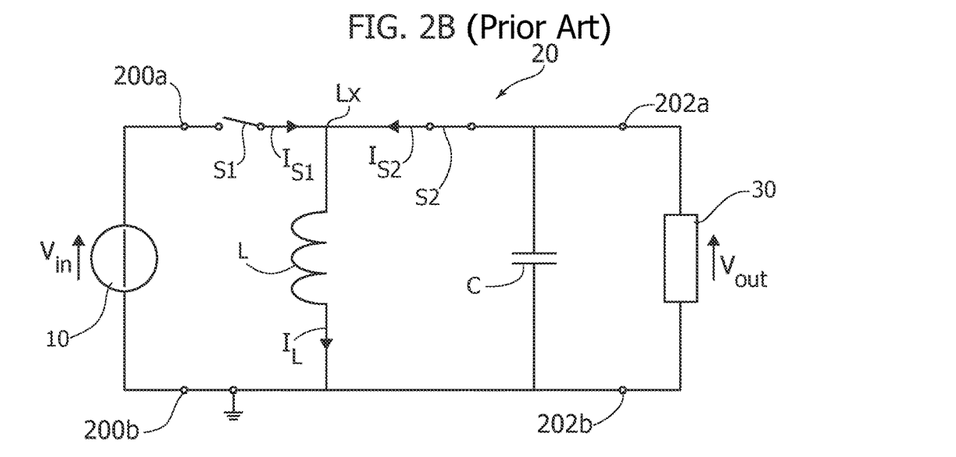

FIGS. 2A and 2B show in this respect the main switching states of such a converter.

Specifically, as shown in FIG. 2A, in a first switching state, the electronic switch S1 is closed and the electronic switch S2 is opened. Accordingly, the inductor L is connected to the input voltage $V_{in}$. Thus, the current $I_L$ flowing through the inductor L increases substantially linearly.

Conversely, as shown in FIG. 2B, in a second switching state, the electronic switch S1 is opened and the electronic switch S2 is closed. Accordingly, the inductor L is connected to the output voltage $V_{out}$ and the capacitor C. Thus, the current $I_L$ flowing through the inductor L decreases and is transferred to the converter output/charges the capacitor C. Assuming that the terminal 200a is a positive input terminal with respect to the negative input terminal 200b, i.e., the voltage $V_{in}$ is positive, and taking into account also the flow direction of the inductor current $I_L$, the terminal 202b will thus be a positive output terminal and the terminal 202a will be a negative output terminal, i.e., the voltage $V_{out}$ is negative.

Figure 3A:
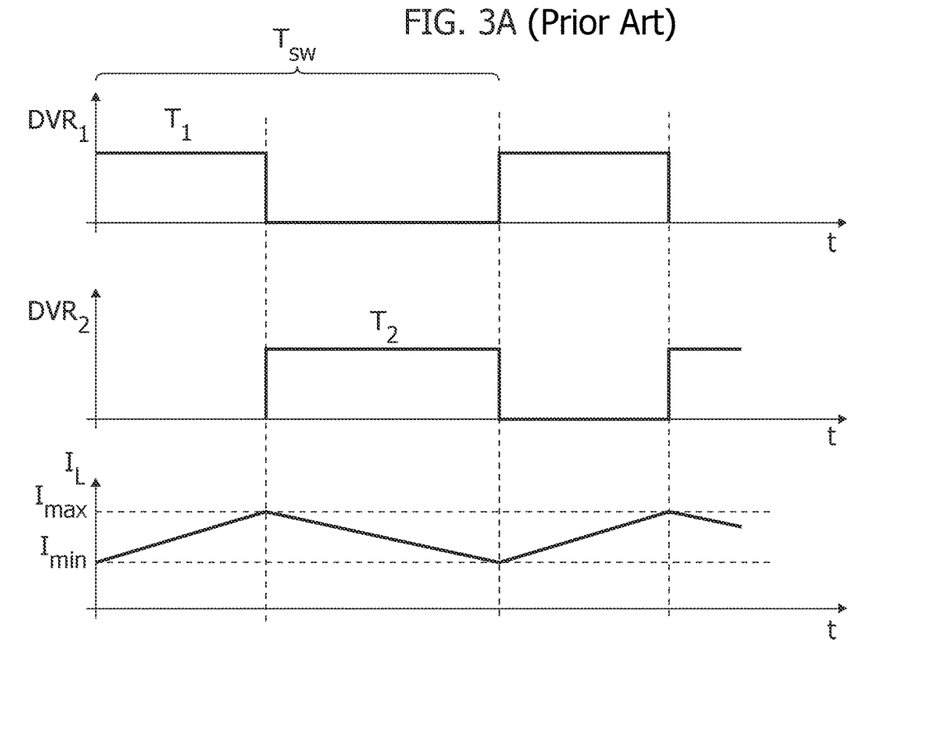
FIGS. 3A and 3B show possible operating modes of the converter of FIG. 1.
Figure 3B:
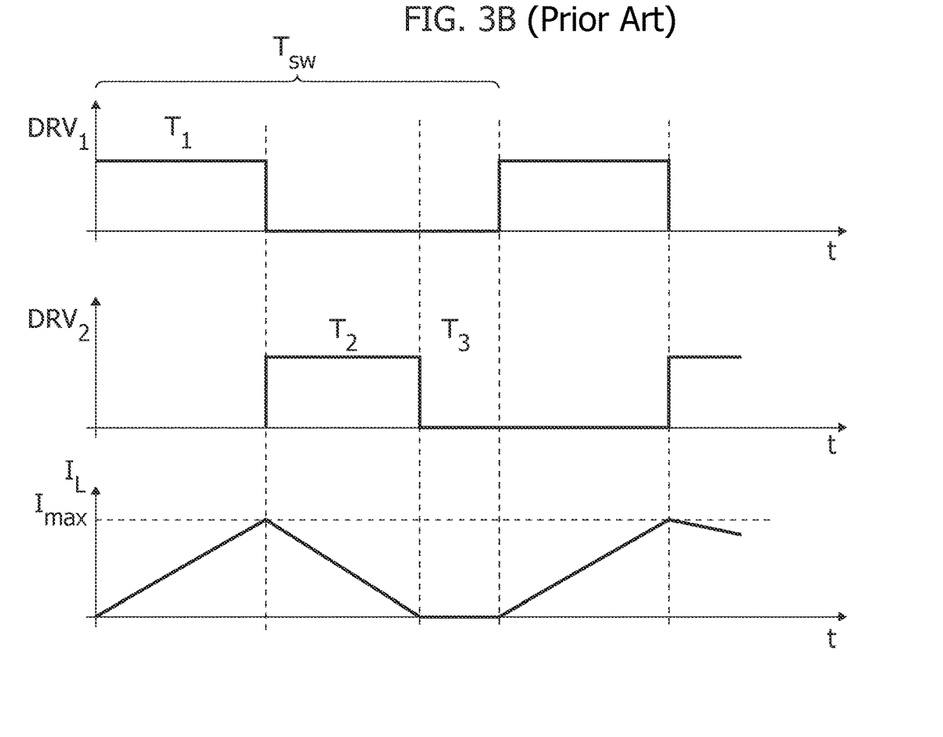

Such an inverting buck-boost converter may thus be operated essentially with two modes, which are shown in FIGS. 3A and 3B.

As shown in FIG. 3A, when the current $I_L$ flowing through the inductor L never falls to zero during a commutation cycle $T_{SW}$, the converter is said to operate in continuous conduction mode (CCM). In this case, the converter is operated during a first time interval $T_1$ with the switching mode shown in FIG. 2A and for a second time interval $T_2$ with the switching mode shown in FIG. 2B, with $T_{SW}=T_1+T_2$.

Conversely, as shown in FIG. 3B, when the current $I_L$ flowing through the inductor L falls to zero during a commutation cycle $T_{SW}$, the converter is said to operate in discontinuous conduction mode (DCM). Typically, this is the case when the amount of energy required by the load 30 is small enough to be transferred in a time smaller than the whole commutation period. Substantially, in this case, the converter has three switching phases $T_1$, $T_2$ and $T_3$, with $T_{SW}=T_1+T_2+T_3$. Specifically, the converter is again operated with the switching mode shown in FIG. 2A during the first time interval $T_1$ and with the switching mode shown in FIG. 2B during the second time interval $T_2$. Conversely, during the third time interval $T_3$ both electronic switches S1 and S2 are opened and the inductor current $I_L$ is zero. Specifically, the interval $T_2$ ends and the interval $T_3$ starts when the inductor current $I_L$ reaches zero.

Various kinds of control may thus be implemented in the control circuit 210. For example, one of the most widely used control scheme is a Pulse Width Modulation (PWM), wherein the switching period $T_{SW}$ is constant and the drive signal $DRV_1$ corresponds to a PWM signal, wherein the control circuit varies the duty cycle of the signal $DRV_1$ as a function of the output voltage $V_{out}$. In this case, the control circuit 210 implements typically a regulator comprising an Integral (I) component and possibly also a Proportional (P) and/or Derivative (D) component. Conversely, the switch S2 is closed when the switch S1 is opened and the switch S2 is opened again either when a new switching cycle starts (CCM mode) or when the inductor current $I_L$ reaches zero (DCM mode).

Another scheme of control is the pulse skip mode (PSM) or burst mode. In this case, the interval $T_1$ has typically a fixed duration and the interval $T_1$ starts when the output voltage $V_{out}$ falls below a given threshold voltage. Thus, in this case a sequence of pulses or bursts is generated until the output voltage $V_{out}$ is greater than the given threshold voltage. In this case, the pulse generation is stopped until the output voltage $V_{out}$ falls again below the given threshold voltage.

Thus, in the example considered, the node Lx represents the main switching node of the electronic converter 20 and its slew-rate should be controlled to reduce EMI. Thus, the control circuit 210 should correctly implement slew-rate controlled transition in all operating condition supported by the converter 20 (Continuous Current Mode, Discontinuous Current Mode, Pulse Skip Mode).

Considering the foregoing, there is a need in the art to provide solutions for driving electronic switches, in particular field effect transistors (FET).

SUMMARY

Various embodiments of the present disclosure relate to a half-bridge circuit. In various embodiments, the half-bridge circuit comprises a first, a second and a third terminal, wherein the voltage at the third terminal represents a reference voltage. A half-bridge comprising a first and a second n-channel (power) FET is connected in series between the first and the second terminal, wherein the intermediate node between the first and the second n-channel FET represents a switching node.

For example, in various embodiments an inductance is connected between the switching node and the third terminal. In this case, the half-bridge circuit may be an inverting buck-boost converter, wherein the first terminal and the third terminal are configured to receive an input voltage and the second terminal and the third terminal are configured to provide an output voltage. In various embodiments, such electronic converters are operated in a discontinuous conduction mode or a pulse skip mode. Alternatively, the half-bridge circuit may be a buck converter, wherein the first terminal and the second terminal are configured to receive an input voltage, and the third terminal and the second terminal are configured to provide an output voltage.

In various embodiments, a first and a second driver circuits are configured to drive the gate terminal of the first n-channel (power) FET and the gate terminal of the second n-channel (power) FET as a function a first and a second drive signal, respectively.

In various embodiments, the second driver circuit has an associated a voltage regulator. Specifically, this voltage regulator is configured to generate at an output terminal a first supply voltage as a function of the voltage between the first and the second terminal, wherein the first supply voltage is used to supply the second driver circuit. In various embodiments, the second driver circuit may perform a slew rate control. In this case, the second driver circuit may be configured to generate a (positive or negative) charge current at the gate terminal of the second n-channel (power) FET as a function of the second drive signal, thereby charging a gate-source capacitance of the second n-channel FET to: the first supply voltage, thereby closing the second n-channel FET, or the voltage at the second terminal, thereby opening the second n-channel FET.

Conversely, in various embodiments, the first driver circuit is a driver circuit without slew-rate control configured to set an output node of the first driver circuit to the reference voltage or a second supply voltage as a function of the first drive signal. For example, the first driver circuit may comprise a further half-bridge comprising two electronic switches connected between the second supply voltage and the reference voltage, wherein an intermediate node between the two electronic switches represents the output node. In this case, a further half-bridge driver may generate the drive signals for the two electronic switches as a function of the first drive signal. For example, in various embodiments, the high-side electronic switch is a p-channel FET and the low-side electronic switch is an n-channel FET.

In various embodiments, slew rate control of the high side n-channel (power) FET is obtained via a circuit connected between the output terminal of the first driver circuit and the gate terminal of the high side n-channel (power) FET. Specifically, in various embodiments, this circuit comprises a first resistor and a capacitor connected in series between the output node and an intermediate node. A first electronic switch is connected between the intermediate node and the first terminal. Moreover, a second electronic switch is connected between the intermediate node and the gate terminal of the first n-channel FET, and a second resistor and a third electronic switch are connected in series between the gate terminal of the first n-channel FET and the switching node. For example, the first and the third electronic switches may be n-channel FETs, such as NMOS, and the second electronic switch may be a p-channel FET, such as a PMOS.

In various embodiments, the switching of the various switches is controlled via a control circuit. Specifically, as will be described in greater detail in the following, the control circuit may be configured to: for a first time interval, set the first and the second drive signals to close the first n-channel (power) FET and to open the second n-channel (power) FET, and set a first, a second and a third control signal to open the first and the third electronic switch and to close the second electronic switch; and for the second time interval, set the first and the second drive signals to open the first n-channel (power) FET and close the second n-channel (power) FET, and set the first, second and third control signal to close the first and the third electronic switches and open the second electronic switch.

Specifically, in this way, slew rate control may be obtained by dimensioning the capacitor and the two resistors. For example, in various embodiments, the capacitance of the capacitor is in a range of 200 pF to 2 nF, preferably, between 200 pF and 500 pF, and/or the resistance of the first and the second resistors is in a range between 50-500 Ohms.

As mentioned before, in various embodiments, the control circuit may also manage a DCM o pulse-skip mode. In this case, the control circuit may be configured to: for a third time interval, set the first and the second drive signals to open both the first and the second n-channel FET, and set the first, second and third control signal to close the first and the third electronic switch and open the second electronic switch.

BRIEF DESCRIPTION OF THE DRAWINGS

The embodiments of the present disclosure will now be described with reference to the annexed plates of drawings, which are provided purely to way of non-limiting example and in which.

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

In FIGS. 4 to 12 described below, parts, elements or components that have already been described with reference to FIGS. 1 to 3 are designated by the same references used previously in these figures. The description of these elements has already been made and will not be repeated in what follows in order not to burden the present detailed description.

As explained in the foregoing, various embodiments of the present description concern solutions for driving Field Effect Transistors, in particular in the context of a half-bridge, such as the electronic switches of an inverting buck-boost converter. In particular, various embodiments of the present disclosure relate to a half-bride driver for the switches of such a half-bridge.

Figure 4:
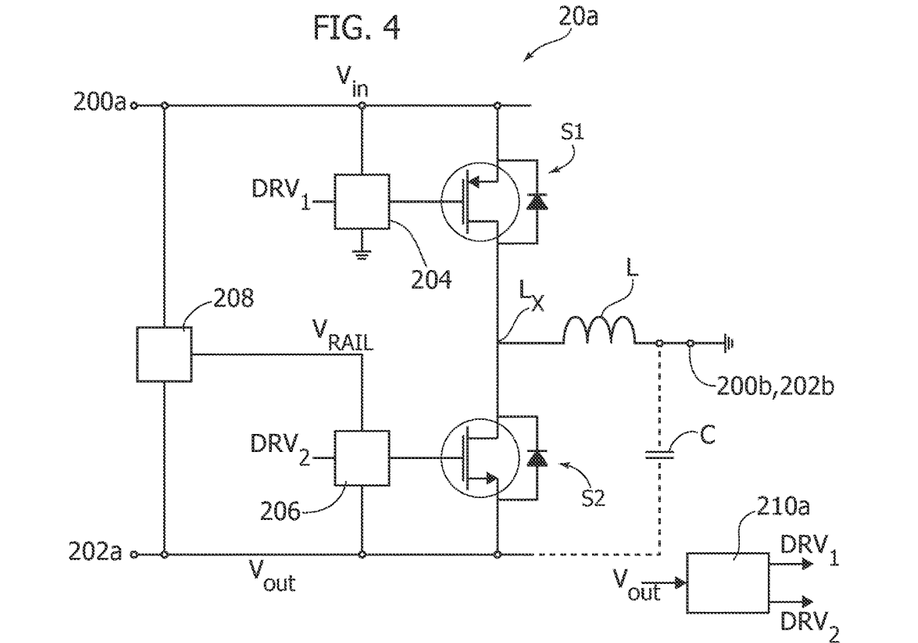
FIG. 4 shows a first embodiment of a half-bridge driver circuit.

FIG. 4 shows a first solution for driving a half-bridge. Specifically, FIG. 4 shows a generic half-bride circuit 20a.

Accordingly, the circuit comprises two terminals 200a and 202a, wherein a half-bridge comprising two electronic switches S1 and S2 is connected (e.g., directly) between these two terminals. Specifically, in various embodiments, the switches are FET, such as MOSFET. Such transistors have typically associated a respective body diode, which are schematically shown in FIG. 4. Accordingly, in the embodiment considered, the half-bridge is connected between a first voltage at the terminal 200a and a second voltage at the terminal 202a.

Generally, the intermediate node between the electronic switches S1 and S2 represents a switching node Lx, and by driving the switches S1 and S2 in a suitable manner, the switching node Lx may be: connected to the voltage at the node 200a by closing the electronic switch S1 and opening the electronic switch S2 (as shown with respect to the interval $T_1$ in FIG. 3B); connected to the voltage at the node 202a by opening the electronic switch S1 and closing the electronic switch S2 (as shown with respect to the interval $T_2$ in FIG. 3B); or disconnected by opening both the electronic switch S1 and the electronic switch S2 (as shown with respect to the interval $T_3$ in FIG. 3B).

For example, in the context of an inverting buck-boost converter, the switching node Lx may be connected via an inductor L to a further terminal of the half-bridge circuit 20a. For example, this further terminal corresponds to the terminals 200b and 202b shown in FIG. 1. However, such a half-bridge circuit 20a may also be used to drive other inductive components, e.g., the inductor L may be replaced directly with an inductive load, such as an electric motor.

In fact, in order to drive such inductive components, it is sufficient that the voltage between the terminals 200a and 200b/202b is positive and the voltage between the terminals 202a and 200b/202b is negative. For example, in the case of an inverting buck-boost converter, the terminal(s) 200b/202b are connected to ground, the terminal 200a is connected to the (positive) input voltage $V_{in}$ (with respect to the terminal(s) 200b/202b) and the terminal 202a is connected to the (negative) output voltage $V_{out}$ (with respect to the terminal(s) 200b/202b).

In various embodiments, a capacitor C may be connected (e.g., directly) between the terminals 202a and 200b/202b.

As mentioned in the foregoing, various embodiments relate specifically to the driving of the transistors S1 and S2, permitting a slew-rate control of the switching node Lx.

Specifically, in the embodiment shown in FIG. 4, the switch S1, representing a high-side switch of the half-bridge, is a p-channel FET, such as a p-channel MOSFET, i.e., a PMOS. Conversely, the switch S2, representing a low-side switch of the half-bridge, is a n-channel FET, such as a n-channel MOSFET, i.e., a NMOS.

In the embodiment considered, a control circuit 210a provides digital control signals $DRV_1$ and $DRV_2$, typically having either a low or a high logic level, which should be converted into respective drive signals for the gate terminals of the transistors S1 and S2, implementing also a slew-rate control.

For this purpose, the transistor S1 has associated a driver circuit 204 configured to receive the (binary) control signal $DRV_1$ and generate a signal, typically a current signal, used to drive the gate terminal of the transistor S1 and generate a suitable gate-source voltage $V_{GS}$ at the gate-source capacitance of the transistor S1. For example, by varying the charge current of the gate-source capacitance provided by the driver circuit 204, the driver circuit 204 may implement a slew-rate control.

Similarly, the transistor S2 has associated a driver circuit 206 configured to receive the (binary) control signal $DRV_2$ and generate a signal, typically a current signal, used to drive the gate terminal of the transistor S1 and generate a suitable gate-source voltage $V_{GS}$ at the gate-source capacitance of the transistor S1. For example, by varying the charge current of the gate-source capacitance provided by the driver circuit 206, the driver circuit 206 may implement a slew-rate control.

For example, for a possible generation of such a current in order to implement a slew-rate control, reference can be made again to the above cited document United States Patent Publication No. 2017/0222638 A1.

Such a slew-rate control usually requires that the driver circuits receive rather stable supply voltages. For example, assuming that the voltages at the nodes 200a and 200b are rather stable with respect to the voltage at the node 200b/202b (which is usually also the case for an inverting buck-boost converter), the driver circuit 204 could drive the gate terminal of the PMOS S1 between the voltage at the node 200a ($V_{in}$) and the voltage at the node 200b/202b (e.g., ground). Conversely, the driver circuit 206 could drive the gate terminal of the NMOS S2 between a voltage $V_{RAIL}$ and the voltage at the terminal 202a ($V_{out}$), wherein the voltage $V_{RAIL}$ is greater than the voltage at the terminal 202a ($V_{out}$). For example, in FIG. 4 there is shown a voltage regulator 208 configured to generate the voltage $V_{RAIL}$ based on the voltage between the terminals 200a and 202a. For example, in various embodiments the voltage regulator 208 may be a linear voltage regulator.

It will be noted that this architecture has several drawbacks, in particular concerning the use of a PMOS power transistor S1. In fact, such PMOS power transistors are usually less optimized than NMOS power transistors. For example, a larger area is needed for a PMOS transistor in order to match the switch on resistance $R_{ON}$ achievable with an NMOS transistor and this larger dimension may require a significantly larger driver 204, resulting also in a greater noise during normal switching activity of the half-bridge.

Moreover, dependent on the specific application, the voltage $V_{in}$ between the terminals 200a and 200b/202b may have a voltage swing, which is often the case in electronic converters. In this case, the PMOS S1 has to be over-designed to match the switch on resistance $R_{ON}$ also with a lower voltage $V_{in}$, which would result also in a small gate-source voltage $V_{GS}$ at the PMOS S1.

Generally, this problem could be avoided by providing an additional voltage regulator also for supplying the driver circuit 204. Generally, such an additional voltage regulator could also be useful when the voltage $V_{in}$ is significantly higher than the requested gate-source voltage $V_{GS}$. However, such an additional voltage regulator would increase the complexity and cost of the circuit 20a.

Figure 5:
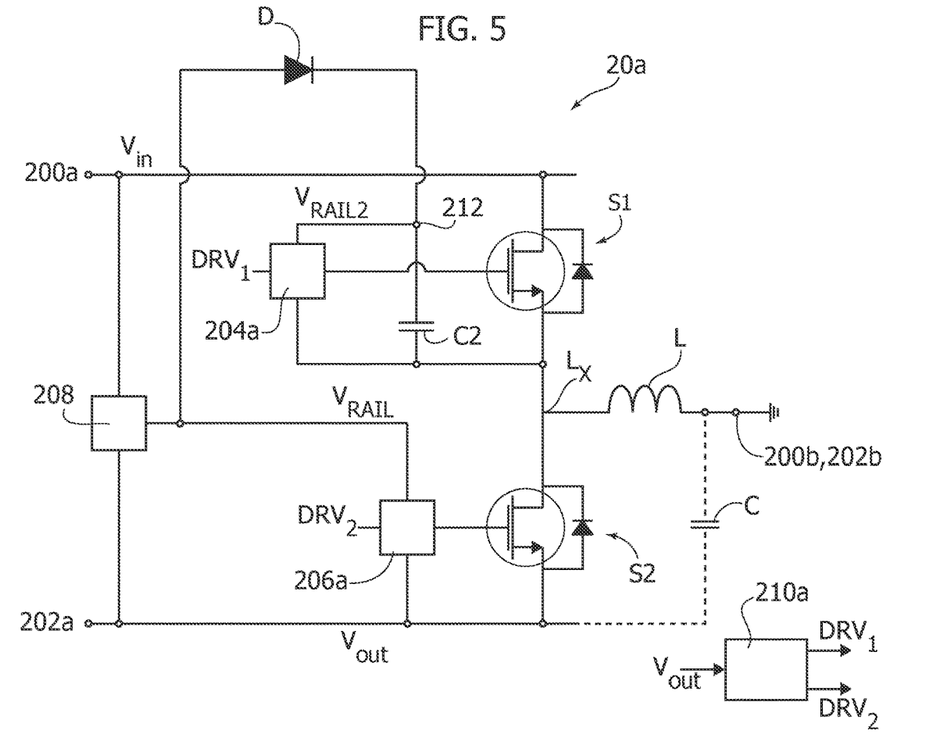
FIG. 5 shows a second embodiment of a half-bridge driver circuit.

FIG. 5 shows a solution of the circuit 20a able to overcome the drawbacks of the solution shown in FIG. 4.

In the embodiments considered, the transistors S1 and S2 are n-channel FET, such as NMOS. Moreover, the gate terminal of the transistor S2 is driven via the driver circuit 206 and the respective voltage regulator 208 already described with respect to FIG. 4. However, the driving of the gate terminal of the transistor S1 is different. Specifically, in the embodiment considered, the gate terminal of the transistor S1 is driven by a driver circuit 204a, wherein the driver circuit 204a is powered via a bootstrap circuit, essentially comprising a diode D and a capacitor C2.

More specifically, in the embodiment considered, the output of the voltage regulator 208 providing the voltage $V_{RAIL}$ is connected via the diode D and the capacitor C2 to the switching node Lx. Specifically, the anode of the diode D is connected (e.g., directly) to the voltage $V_{RAIL}$ the cathode of the diode D is connected (e.g., directly) to a first terminal of the capacitor C2, indicated in the following as node 212, and the second terminal of the capacitor is connected (e.g., directly) to the node Lx.

Substantially, when the switch S2 is closed, the switching node Lx is connected to the terminal 202a and the capacitor C2/node 212 is charged to a voltage $V_{RAIL2}=V_{RAIL}-V_{DIODE}$ (where $V_{DIODE}$ corresponds to the forward voltage of the diode D). Conversely, when the switch S2 is opened, the capacitor C2 will maintain the voltage $V_{RAIL2}=V_{RAIL}-V_{DIODE}$, irrespective of the voltage at the switching node Lx, i.e., the node 212 will have a voltage being greater than the voltage at the source terminal of the transistor S1. Thus, by powering the driver 204a with the voltage at the capacitor C2, the driver circuit 204a may drive the gate terminal of the transistor S1 with a voltage selected between $V_{Lx}$ and $V_{RAIL2}+V_{Lx}$.

Accordingly, in the embodiment considered and similar to what is described in United States Patent Publication No. 2017/0222638 A1, the driver circuits 204a and 206 are powered via respective positive supply voltages $V_{RAIL2}$ and $V_{RAIL}$ (indicated generically as Vdd in document United States Patent Publication No. 2017/0222638 A1), which are referred to the source terminal of the respective transistor.

It is noted that the solution shown in FIG. 5 does not operate always correctly. Specifically, the solution shown in FIG. 5 may be used when the inductor L is operated in the CCM mode (see also FIG. 3A), because the node Lx is connected during the interval $T_2$ regularly to node 202a, thereby ensuring that the capacitor C2 is re-charged. Conversely, in the DCM and in particular the PSM mode (see also FIG. 3B), the switching node Lx is disconnected and has essentially the voltage of the node 200b/202b. However, this voltage is usually greater than the voltage $V_{RAIL}$, i.e., the capacitor C2 is not charged further. Thus, in the embodiment shown in FIG. 5, the capacitor C2 is not charged during the interval $T_3$. Thus, in the case where the interval $T_3$ is long, as it is usually the case for the PSM mode (in which one or more switching cycles may be switched essentially by setting $T_3=T_{SW}$), the capacitor C2 may be discharged and the voltage $V_{RAIL2}$ may be insufficient in order to correctly drive the transistor S1.

Figure 6:
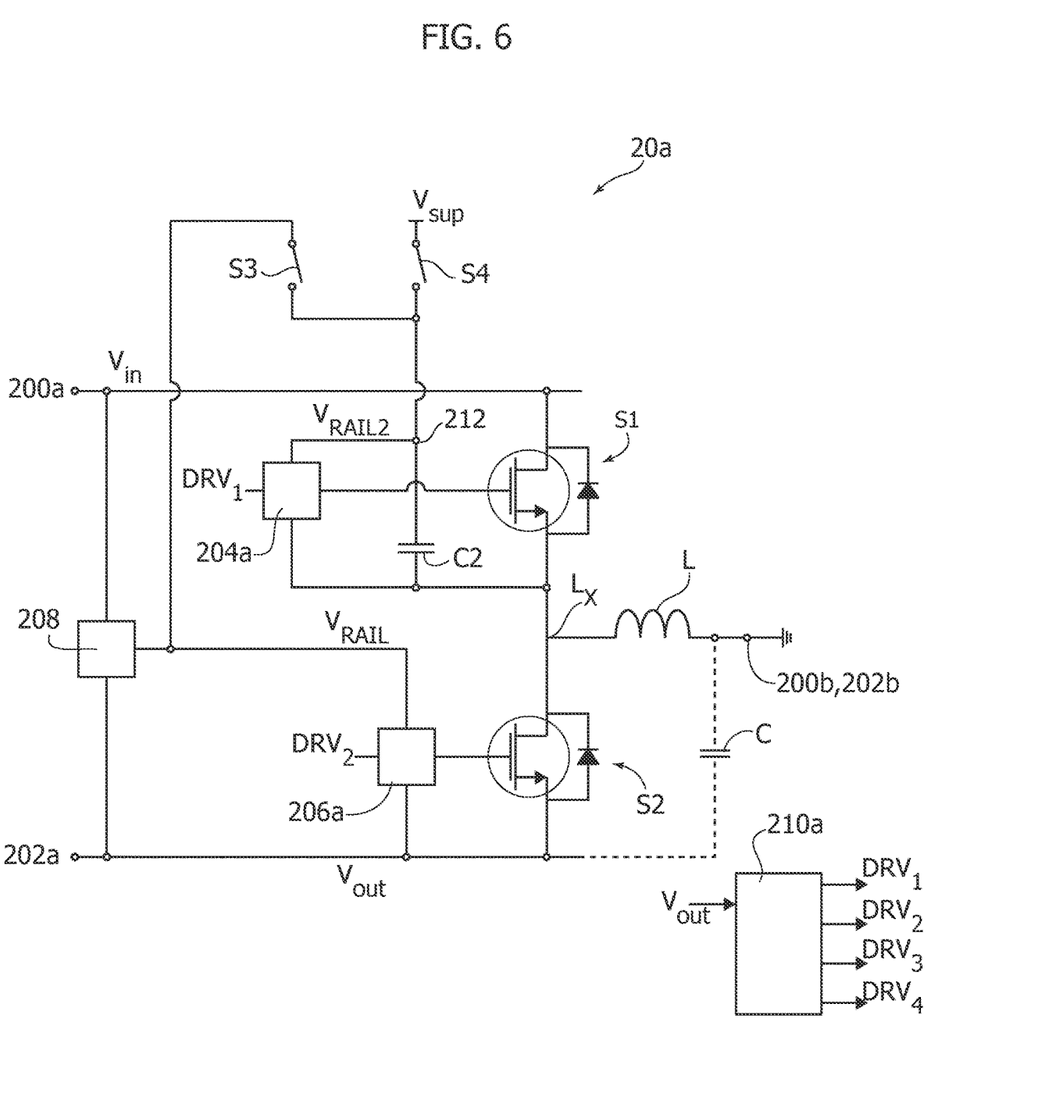
FIG. 6 shows a third embodiment of a half-bridge driver circuit.

FIG. 6 shows a modified solution of the circuit 20a, which is also described in greater detail in U.S. application for patent Ser. No. 16/924,410 (corresponding to Italian Patent Application 102019000011544), incorporated by reference.

Specifically, again the circuit 20a comprises at least three terminals 200a, 202a and 200b/202b.

In the embodiment considered, again a half-bridge comprising two n-channel FET S1 and S2, such as NMOS, is connected between the terminals 200a and 202a. Specifically, the drain terminal of the transistor S1 is connected (e.g., directly) to the terminal 200a, the source terminal of the transistor S1 is connected (e.g., directly) to the drain terminal of the transistor S2 and the source terminal of the transistor S1 is connected (e.g., directly) to the terminal 202a.

Moreover, the intermediate node/switching node Lx between the transistors S1 and S2, i.e., the source terminal of the transistor S1/the drain terminal of the transistor S2, is connected (e.g., directly) via an inductance L, to the terminal 200b/202b. For example, in case of an electronic converter, the inductive component L may be an inductor or a transformer. However, the inductive component L may also be directly an inductive load, such as an electric motor. In various embodiments, a capacitor C may be connected (e.g., directly) between the terminal(s) 200b/202b and the terminal 202a.

For example, as described in the foregoing, in case of an inverting buck-boost converter, the terminals 200a and 200b represent input terminals to be connected to an input voltage $V_{in}$, and the terminals 202a and 202b represent output terminals used to provide an output voltage $V_{out}$. Conversely, in a buck converter, the terminals 200a and 202a would represent the input terminals to be connected to an input voltage, and the terminals 200b/202b and 202a would represent the output terminals used to provide an output voltage corresponding to the voltage at the capacitor C.

In the embodiment considered, the gate terminal of the low-side transistor S2 is again driven via a driver circuit 206 as a function of the drive signal $DRV_2$. Specifically, for this purpose, the circuit 20a comprises a voltage regulator 208 configured to generate a voltage $V_{RAIL}$ (being greater than the voltage at the terminal 202a, e.g., $V_{out}$) as a function of the voltage between the terminals 200a and 202a, i.e., the voltage regulator 208 receives at input the voltage ($V_{in}$-$V_{out}$) between the terminals 200a and 202a, and provides at output a voltage $V_{RAIL}$, which is referred to the terminal 202a. Accordingly, the driver circuit 206 may drive the gate terminal of the transistor S2 with a voltage (with respect to the terminal 202a/source terminal of the transistor S2) selected between zero and $V_{RAIL}$. For example, in various embodiments, the voltage $V_{RAIL}$ may be selected between 3 and 12 VDC, e.g., 5 VDC (with respect to the voltage $V_{out}$ at the terminal 202a).

In the embodiment considered, the gate terminal of the high-side transistor S2 is driven via a driver circuit 204a as a function of the drive signal $DRV_1$. Specifically, in the embodiment considered, the driver circuit 204a is powered via a positive voltage at a (bootstrap) capacitor C2. More specifically, in the embodiment considered, a first terminal of the capacitor C2, indicated again with node 212, is connected (e.g., directly) via an electronic switch S3 to the output of the voltage regulator 208 providing the voltage $V_{RAIL}$ and the second terminal of the capacitor C2 is connected (e.g., directly) to the switching node Lx. Accordingly, in the embodiment considered, the diode D of FIG. 6 has been replaced with the electronic switch S3.

Moreover, in the embodiment considered, the first terminal of the capacitor C2/node 212 is connected (e.g., directly) via a further electronic switch S4 to a positive supply voltage $V_{sup}$. In various embodiments, the voltage $V_{sup}$ is a positive voltage referred to the terminal 200b/202b, e.g., ground. For example, the voltage $V_{sup}$ may be identical to $V_{RAIL}$ as voltage range but referred to the terminal 200b/202b.

Accordingly, in the embodiment considered, the node 212 may be connected selectively via the switch S3 to the voltage $V_{RAIL}$ (being referred to the terminal 202a) or via the switch S4 the voltage $V_{sup}$ (being referred to the terminal 200b/202b). Moreover, the voltage $V_{RAIL2}$ at the node 212 (being referred to the node Lx) is used to power the driver 204a.

In the embodiment considered, the electronic switches S1, S2, S3 and S4 are driven via a control circuit 210a, which generates respective drive signal $DRV_1$, $DRV_2$, $DRV_3$, and $DRV_4$. Generally, insofar as the switches S3 and S4 may be low-power switches, no specific slew-rate control may be required for these switches.

Figure 7:
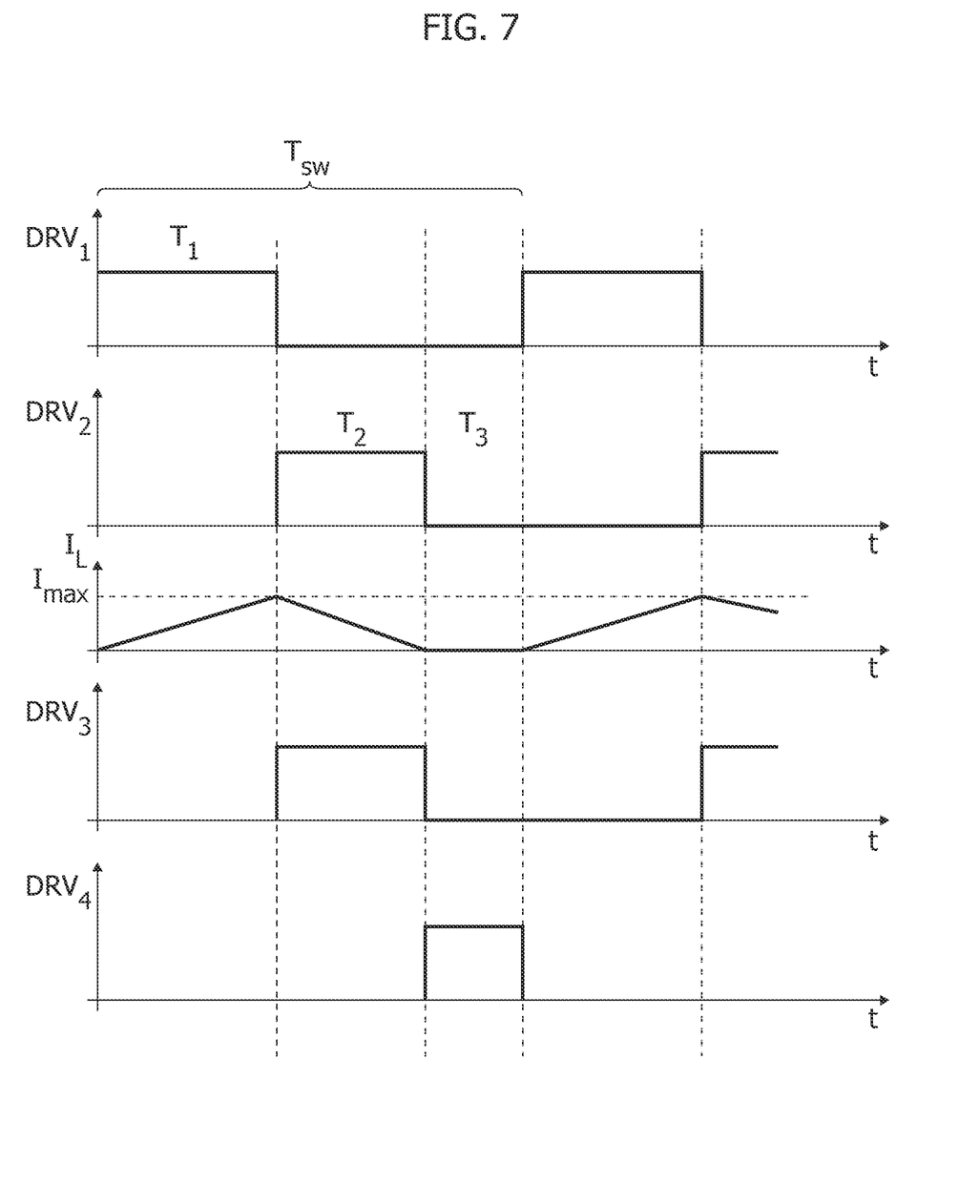
FIG. 7 shows an embodiment of the operation of the half-bridge driver circuit of FIG. 6.

FIG. 7 shows an example of the driving implemented within the control unit 210a.

As described in the foregoing, the intermediate node between the electronic switches S1 and S2 represents a switching node Lx, and by driving the switches S1 and S2 via the drive signals $DRV_1$ and $DRV_2$, the control circuit 210a may: close the electronic switch S1 and open the electronic switch S2, thereby connecting the switching node Lx to the voltage at the node 200a (interval $T_1$); open the electronic switch S1 and close the electronic switch S2, thereby connecting the switching node Lx to the voltage at the node 202a (interval $T_2$); and open both the electronic switch S1 and the electronic switch S2, thereby disconnecting the switching node Lx (interval $T_3$).

For example, in various embodiments, the above sequence of three intervals $T_1$, $T_2$ and $T_3$ are repeated periodically.

In various embodiments, the control circuit 210a is configured to drive the switches S3 and S4 via the drive signals $DRV_3$ and $DRV_4$, in order to: close the electronic switch S3 and open the electronic switch S4, when the electronic switch S1 is opened and the electronic switch S2 is closed, i.e., during the interval $T_2$ of FIG. 3B; open the electronic switch S3 and close the electronic switch S4, when the electronic switch S1 is opened and the electronic switch S2 is opened, i.e., during the interval $T_3$ of FIG. 3B; and open the electronic switch S3 and open the electronic switch S4, when the electronic switch S1 is closed and the electronic switch S2 is opened, i.e., during the interval $T_1$ of FIG. 3B.

Accordingly, when the electronic switch S1 is opened and the electronic switch S2 is closed, the switching node Lx is connected to the node 202a and the node 212/capacitor C2 is charged to the voltage $V_{RAIL}$ via the switch S3. Conversely, when the electronic switch S1 is opened and the electronic switch S2 is opened, the switching node Lx is disconnected and the node 212/capacitor C2 is charged to the voltage $V_{sup}$ via the switch S4.

Accordingly, when the switch S1 has to be closed at the beginning of the interval $T_1$, the capacitor C2 is charged either to the voltage $V_{RAIL}$ (switching at the end of the interval $T_2$) or $V_{sup}$ (switching at the end of the interval $T_3$). Thus, when the control circuit 210a sets the drive signal $DRV_1$ at the beginning of the interval $T_1$, the voltage $V_{RAIL2}$ at the node 212 is shifted via the capacitor C2 following the voltage increase at the switching node Lx. Thus, when the electronic switch S1 is completely closed and the electronic switch S2 is opened, the switching node Lx is connected to the node 200a and the node 212 has a voltage $V_{RAIL}+V_{in}$ or $V_{sup}+V_{in}$, which thus permits to maintain closed the transistor S1.

Moreover, while closing the transistor S1, the driver circuit 204a is always powered with a substantially constant floating rail voltage $V_{RAIL2}$ generated with the bootstrap capacitor C2 (voltage between the node 212 and the switching node Lx), which permits to implement a slew-rate control also for high-side transistor S1. Thus, also a slew-rate controlled transition of the switching node Lx may be implemented, which permits to attenuate EMI disturbance generated by the switching activity.

For example, in this way, the driver circuits 204a and 206 may have the same architecture, and only the power supply of the respective driver circuit changes. Specifically, the low-side driver 206 operates with a supply voltage between the voltages $V_{OUT}$ (voltage at the source terminal of transistor S2) and $V_{RAIL}$, while the high-side driver 204a operates with a supply voltage between the voltage at the switching node Lx (voltage at the source terminal of transistor S1) and the voltage provided by the bootstrapped net. For example, the driver circuits 204a and 206 may be configured to receive the (binary) control signal $DRV_1$ and $DRV_2$, respectively, and generate respective signals, typically current signals, used to drive the gate terminal of the respective transistor S1 and S2, thereby charging the gate-source capacitance of the respective transistor S1 and S2. Accordingly, by varying the charge current of the gate-source capacitance, the driver circuit 204 and 206 may selectively vary the gate-source voltage $V_{GS}$ of the respective transistor S1 and S2 in order to implement a slew-rate control.

In various embodiments, in order to correctly recharge the capacitor C2 in all operating conditions of the converter, two different paths of recharge are provided for the bootstrapped capacitor C2. When working in CCM, the switching node Lx will continuously swing between the voltages $V_{in}$ (S1 closed) and $V_{out}$ (S2 closed) and during this last phase the bootstrap capacitor C2 will be recharged between $V_{out}$ and $V_{RAIL}$. Thus, at the next switching cycle (beginning of interval $T_1$), the capacitor C2 is charged and permits to correctly manage the activation of the high-side transistor S1.

Conversely, when working in DCM/PSM, the switching node Lx will swing between $V_1$ (S1 closed), $V_{out}$ (S2 closed) and then GND (S1 and S2 opened).

Specifically, when working in PSM, some switching cycles are skipped, i.e., after a DCM switching cycle, the switching node Lx will stay at GND (interval $T_3$). During this time, the bootstrap capacitor C2 is kept fully charged between GND and $V_{sup}$, in order to be able to correctly switch-on the high-side transistor S1 when a new switching cycle is started via the control circuit 210a, e.g., because the output voltage $V_{out}$ falls below a given threshold.

Generally, when operating in DCM, the node 212 may also remain disconnected during the interval $T_3$. In fact, when the time interval $T_3$ is sufficiently short, no further charging of the capacitor C2 may be required during the interval $T_3$. However, as described in the foregoing, the node 212 may also be connected to the voltage $V_{sup}$ during the interval $T_3$.

Accordingly, the gate of the high-side power transistor S1 may be driven in all operating conditions with a well-defined DC supply voltage, thereby avoiding unknown and undesired conditions of the transistor S1.

Generally, while the voltage regulator 208 and the bootstrap circuit (C2, S3 and S4) have been shown separately, these circuits may also be integrated in the driver circuits 204a and 206 and/or may be integrated with the driver circuits 204a and 206 in a half-bridge driver circuit, e.g., in the form of an integrated circuit. Moreover, also the control circuit 210a may be integrated in such an integrated circuit, thereby forming an electronic converter control chip. Generally, the transistors may be internal or external with respect to such an integrated circuit.

The solution shown in FIG. 6 has thus the advantage that a slew-rate control may be implemented within the driver circuits 204a and 206a, but this architecture leads to an increase of circuit and logic complexity, in order to handle the operative modes of the DC/DC converter (CCM/DCM and PSM). Moreover, the increase in complexity also results in a higher current consumption, thereby reducing the efficiency of a DC/DC converter.

Figure 8:
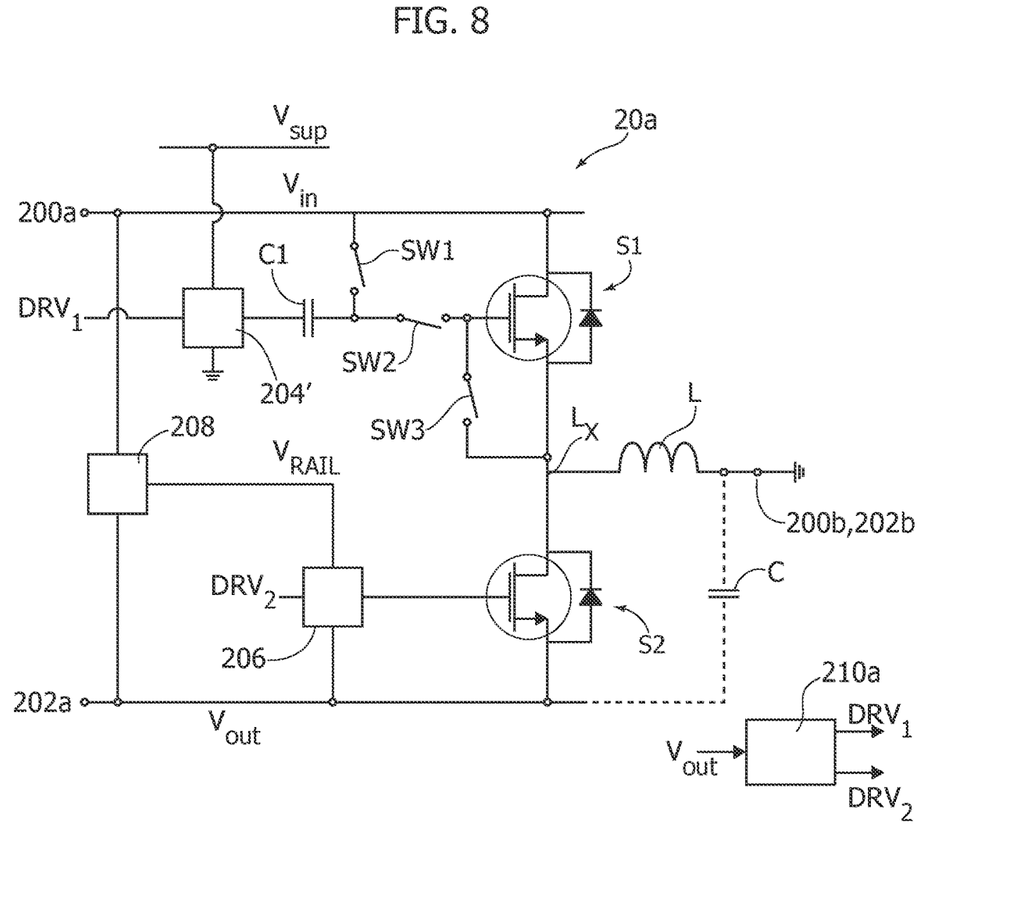
FIG. 8 shows a fourth embodiment of a half-bridge driver circuit.

FIG. 8 shows a first embodiment of the circuit 20a in accordance with the present disclosure. Specifically, in the embodiment considered, the p-channel FET S1 of FIG. 4 has again been replaced with a n-channel FET, such as a NMOS. Accordingly, in the embodiment considered, the drain terminal of the transistor S1 is connected (e.g., directly) to the terminal 200a, the source terminal of the transistor S1 is connected (e.g., directly) to the switching node Lx, which in turn is connected (e.g., directly) to the drain terminal of the transistor S2, and the source terminal of the transistor S2 is connected (e.g., directly) to the terminal 202a.

In the embodiment considered, the gate terminal of the transistor S2 is again driven via the driver circuit 206 as a function of the signal $DRV_2$, wherein the driver circuit may have associated a respective voltage regulator 208 providing the voltage $V_{RAIL}$. Accordingly, in the embodiment considered, the driver circuit may set the gate-source voltage $V_{GS}$ of the transistor S2 either to the voltage $V_{RAIL}$ or zero, while possibly performing a slew-rate control during the transitions.

Conversely, the gate terminal of the transistor S1 is driven via a driver circuit 204' as a function of the signal $DRV_1$, wherein the driver circuit 204' is connected to a voltage $V_{sup}$ and the terminal 200b/202b representing a ground.

Specifically, in the embodiment considered, the signal output by the driver circuit 204' does not directly drive the gate terminal of the transistor S1, but instead a decoupling capacitor C1 is interposed between the driver circuit 204' and the gate terminal of the transistor S1.

Thus, by applying positive and negative transitions to the first terminal of the capacitor C1, these transitions are transferred to the gate terminal of the transistor S1, thereby switching on or off the transistor S1.

In various embodiments, a first electronic switch SW1 may be used to recharge the decoupling capacitor C1 when the NMOS S1 is switched off. For this purpose, a second electronic switch SW2 may be used to disconnect the capacitor C1 from gate terminal of the transistor S1 and a third electronic switch SW3 that shorts the gate terminal of the transistor S1 to the node Lx.

Figure 9:
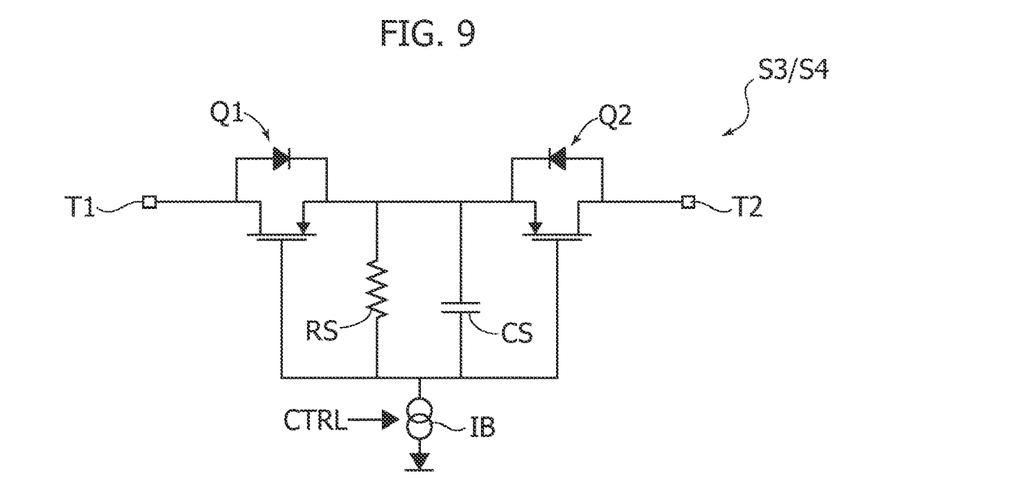
FIG. 9 shows an embodiment of an electronic switch adapted to be used in the half-bridge driver circuit of FIG. 8.

Generally, the electronic switches SW1, SW2 and SW3 may be implemented with any suitable electronic switch, such as transistors, such a FET, e.g., MOSFET. For example, in various embodiments, the electronic switches SW1 and SW3 may be n-channel FETs, e.g., NMOS, and the electronic switch SW2 may be a p-channel FET, e.g., PMOS. Conversely, FIG. 9 shows a possible embodiment of a bi-directional switch which may be used for any of the switches SW1, SW2 and/or SW3.

Generally, the switch comprises a first and a second terminal T1 and T2 defining the current path of the electronic switch, and a control terminal for receiving a control signal CTRL indicating whether the switch should be closed (current may path between the terminals T1 and T2) or opened (current may not path between the terminals T1 and T2).

Substantially, in the embodiments considered, the switch comprises two p-channel FET Q1 and Q2, such as PMOS, in back-to-back configuration. Specifically, the drain terminal of the transistor Q1 is connected to the terminal T1, the source terminal of the transistor Q1 is connected to the source terminal of the transistor Q2 and the drain terminal of the transistor Q2 is connected to the terminal T2. Moreover, each of the transistors Q1 and Q2 comprises a respective (body) diode (with the cathode connected to the source terminal and the anode connected to the drain terminal).

In the embodiments, the switch comprises also a bias circuit configured to charge or discharge the gate terminals of the transistors Q1 and Q2 as a function of the control signal CTRL, thereby opening or closing the switch.

For example, in the embodiment considered, the bias circuit comprises a current generator IB configured to apply a positive or negative current to the gate terminals of the transistors Q1 and Q2 as a function of the control signal CTRL. In various embodiments a filter circuit comprising a resistor RS and a capacitor CS may be connected between the current generator IB and the gate terminals of the transistors Q1 and Q2.

Thus, in the solution shown in FIG. 8 it is again possible to use a couple of NMOS power transistors that can guarantee the best performance achievable in term of switch-on resistance $R_{ON}$, area occupation, gate capacitance and so on.

However, it is noted that with this solution it is not easily possible to apply a slew-rate control to the high-side power transistor S1 insofar as driver circuit 204' does not have any a feedback of the actual gate-source voltage $V_{GS}$ of the transistor S1. Conversely, applying a slew-rate control only to the low-side transistor S2 does not guarantee that the slew-rate of the switching node Lx is always well controlled in all operating conditions of the circuit 20a, e.g., an inverting buck-boost converter.

However, the inventors have observed that the solution shown in FIG. 8 may be modified in order to permit a simple slew-rate control.

Figures 10, 11:
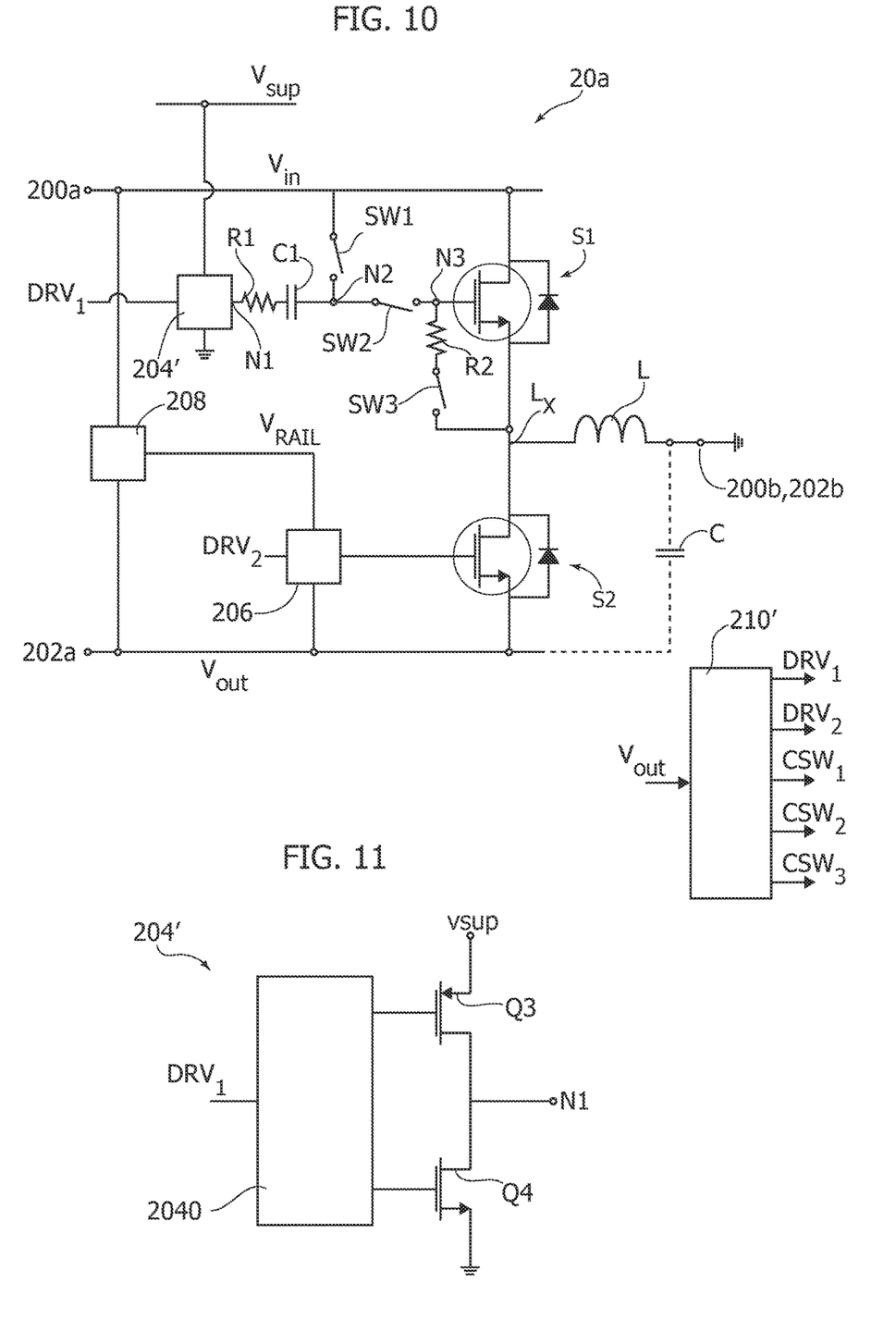
FIG. 10 shows a fifth embodiment of a half-bridge driver circuit.
FIG. 11 shows an embodiment of a high-side driver circuit adapted to be used in the half-bridge driver circuit of FIG. 10.

Specifically, FIG. 10 shows a modified embodiment of the circuit shown in FIG. 8.

Specifically, in the embodiment considered, a resistor R1 has been connected in series with the capacitor C1 between the output of the driver 204' and node N2 and a resistor R2 has been connected in series with the electronic switch SW3 between the gate of transistor S1 and node Lx.

Accordingly, in the embodiment considered, the output terminal (indicated in the following as node N1) of the driver circuit 204' is connected (e.g., directly) via a series connection of the resistor R1 and the capacitor C1 to a node N2. The node N2 is connected (e.g., directly) via the conduction path of electronic switch SW1 to the terminal 200a, i.e., the input voltage $V_{IN}$, and via the conduction path of electronic switch SW2 to the gate terminal (indicated in the following as node N3) of the FET S1. Finally, the node N3 is connected (e.g., directly) via a series connection of the resistor R2 and the conduction path of electronic switch SW3 to the switching node Lx. In various embodiments, instead of connecting the resistor R1 between the nodes N1 and N2, the resistor R1 could also be connected in series with the switch SW2 between the nodes N2 and N3.

In various embodiments, a control circuit 210' may thus generate both the drive signals $DRV_1$ and $DRV_2$ for the driver circuits and drive signals CSW1, CSW2 and CSW3 for the switches SW1, SW2 and SW3, respectively.

Specifically, in various embodiments, the driver circuit 206 is a driver circuit with slew-rate control, while the driver circuit 204' is a driver circuit without slew-rate control configured to generate a voltage signal by amplifying the drive signal $DRV_1$ (having the voltage levels of the driver circuit 210') to the voltage $V_{sup}$. Specifically, in various embodiments, the driver circuit 204' is configured to set the voltage $V_{N1}$ at the node N1 to: $V_{sup}$ (with respect to ground/voltage at the node 200b) when the drive signal $DRV_1$ has a first logic level, e.g., high; and 0 V (with respect to ground/voltage at the node 200b) when the drive signal $DRV_1$ has a second logic level, e.g., low.

For example, FIG. 11 shows a possible embodiment of the driver circuit 204', which comprises: a half bridge comprising two electronic switches Q3 and Q4 connected between the supply voltage $V_{sup}$ and ground/node 200b, wherein the intermediate node between the electronic switches Q3 and Q4 corresponds to the node N1; and a half-bridge driver circuit 2040 configured to drive the electronic switches Q3 and Q4 as a function of the drive signal $DRV_1$.

Generally, insofar as no slew-rate control is required, any suitable half-bride arrangement may be used. For example, in the embodiment considered, the electronic switch Q3 is a p-channel FET, such as a PMOS, and the electronic switch Q4 is a n-channel FET, such as a NMOS.

Figure 12:
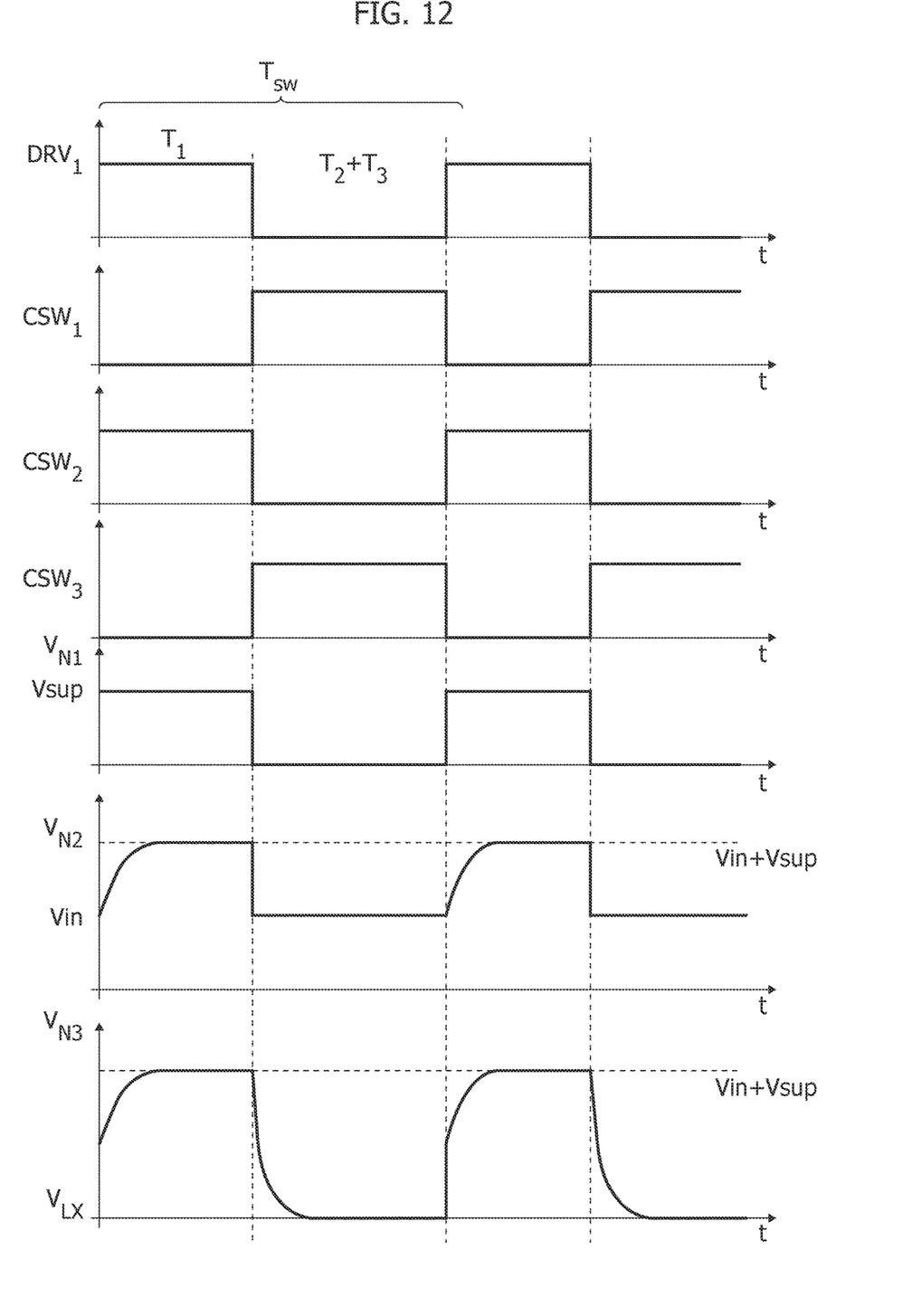
FIG. 12 shows an embodiment of the operation of the half-bridge driver circuit of FIG. 10.

FIG. 12 shows possible waveforms of the drive signals $DRV_1$, CSW1, CSW2 and CSW3, and the voltages VN1 (referred to ground), VN2 (referred to ground) and VN3 (referred to the node Lx) at the nodes N1, N2 and N3, respectively.

Specifically, in the embodiment considered, the driver circuit 210' is configured, during/for the time interval $T_1$, to: set the drive signal $DRV_1$ in order to set the voltage at the node N1 to $V_{sup}$; open the electronic switches SW1 and SW3, e.g., by setting the drive signals CSW1 and CSW3 to low; and close the electronic switch SW2, e.g., by setting the drive signal CSW2 to high. Furthermore, the driver circuit 210' is configured, during/for the time intervals $T_2$ (and the time interval $T_3$ if operated in DCM), to: set the drive signal $DRV_1$ in order to set the voltage at the node N1 to 0 V; close the electronic switches SW1 and SW3, e.g., by setting the drive signals CSW1 and CSW3 to high; and open the electronic switch SW2, e.g., by setting the drive signal CSW2 to low.

Thus, in various embodiments, the logic level of the control signals CSW1, CSW2 and CSW3 corresponds to the logic level of the drive signal $DRV_1$ or its inverted version (based on the implementation of the driver circuit 204' and the circuits used to generate the drive signals for the switches SW1, SW2 and SW3 as a function of the control signals CSW1, CSW2 and CSW3). For example, in various embodiments, the signal $DRV_1$ is also used as control signal CSW2 and the inverted version of the signal $DRV_1$ is used as control signals CSW1 and CSW3.

Accordingly, in various embodiments, during the time intervals $T_2$ and $T_3$ the voltage $V_{N1}$ at the node N1 is set to 0 V and the voltage $V_{N2}$ at the node N2 is set to $V_{in}$, thereby charging the decoupling capacitor C1 to the voltage $V_{in}$.

At the beginning of a time interval $T_1$ the voltage at the node N1 increases in response to the drive signal $DRV_1$ wherein this increase is transferred to the capacitor C1 via the resistor R1, which essentially implement a low pass filter having a given RC time constant. Thus, the voltage at the node N2 increases to $V_{in}+V_{sup}$ with a given charge behavior (as defined by this RC time constant). However, insofar as the switch SW2 is closed and the switch SW3 is opened, the voltage $V_{N2}$ is applied to the gate node N3 of the FET S1. Thus, indeed the voltage at the node N3 increases with a RC time constant comprising not only the resistor R1 and the capacitor C1, but also the gate-source capacitance of the FET S1.

At the beginning of a time interval $T_2$ the switch SW2 disconnects again the node N2 from the node N3, and the electronic switch S3 connects the node N3 to the node Lx via the resistor R2. Accordingly, the gate-source capacitance of the FET S1 is discharged via the resistor R2, whereby the voltage $V_{N3}$ decreases to the voltage at the node Lx. Thus, the voltage at the node N3 decreases with a given discharge behavior as defined by the RC time constant comprising the resistor R2 and the gate-source capacitance of the FET S1.

For example, in various embodiments, the capacitance of the capacitor C1 may be selected in a range of 200 pF to 2 nF, preferably, between 200 pF and 500 pF. Conversely, the resistance of the resistors R1 and R2 may be selected in a range between 50-500 Ohms.

Thus, the operation of the circuit shown in FIG. 11 essentially comprises a recharge phase and a turn-on phase.

When the power FET S1 has to be turned on, the driver circuit 204' sets the node N1 to $V_{sup}$ (while the control circuit 210' opens the switches SW1 and SW3 and closes the switch SW2). Through the flying capacitor C1, this transition is applied to the nodes N2 and N3, i.e., the high-side power FET gate S1. The resistor R1 ensures in this case the desired charge behavior of the node N3, which permits to implement a slew-rate control for switch-on transitions of the node Lx. After a certain amount of time the drive signal $DRV_1$ changes its the logic level indicating that the power FET S1 has to be turned-off. For this procedure, the driver circuit 204' sets to ground the node N1 (while the control circuit 210' closes the switches SW1 and SW3 and opens the switch SW2). In this condition the node N3, i.e., the gate terminal of the power FET S1, is connected to the node Lx via the resistor R2 and the (closed) switch SW3, and the flying capacitor C1 is recharged through the switch SW1 between $V_{in}$ and ground, because the node N1 is connected to ground. The resistor R2 ensures in this case the desired discharge behavior of the node N3, which permits to implement a slew-rate control for switch-off transitions of the node Lx. The same operation is repeated for the following switching cycles $T_{SW}$. Due to the fact, that the switching of the driver circuit 204' and the switches SW1, SW2 and SW3 is only based on the drive signal $DRV_1$, this switching is independent from the operating condition, e.g., of an electronic converter, i.e., the operation works both in CCM (only with time intervals $T_1$ and $T_2$) and DCM or PCM (with time intervals $T_1$, $T_2$ and $T_3$).

Thus, the solution shown in FIG. 10 may be used to drive various kinds of high-side switches with a slew-rate control, such as other half-bridge of full-bridge arrangements.

In fact, in order to correctly drive the power FET, it is sufficient that the supply voltage $V_{sup}$ (referred to ground/terminal 200b) is greater than the gate-source threshold voltage of the FET S1.

Thus, the solution shown in FIG. 10 is based on a capacitive driver with permits also a slew-rate control for the high-side power FET S1. Specifically, slew-rate control may be applied via the two resistors R1 and R2, which act during turn-on and turn-off phase of the high-side power FET. The first resistor R1, placed in series to the capacitor C1, controls the Lx node slew-rate during high-side power FET turn-on transition, while the second resistor R2 connected between the gate and the discharge switch SW3 (then connected to the node Lx) controls the slew rate during high-side power FET turn-off transition. Accordingly, the fact that two different resistors are used for slew-rate control permits also to manage with a different setting the two slew-rate settings.

Generally, the resistors R1 and R2 may be internal or external with respect to the integrated circuit comprising the driver circuit. Moreover, the resistors R1 and R2 may be fixed or variable, e.g., programmable. This implementation permits thus that slew-rate control may be done both live, e.g., during the operation of the DC/DC converter, or during setting phase (calibration/testing) or also fixed during design phase, achieving the best flexible solution from application point of view.

As mentioned before, these enhancements in the turn-on path (via the resistor R1 and capacitor C1) and turn-off path (via the resistor R2) of the power FET make it possible to control slew-rate in all operating condition (CCM/DCM and PSM) and with both positive and negative voltages. For example, no instabilities occur in DCM or PSM, insofar as the nodes N1, N2 and N3 are not floating during the time interval $T_3$, e.g., the node N3 remains connected to the node Lx.

Another important feature of this implementation is that its simplified structure permits to reduce the area occupation, design complexity and current consumption. This last enhancement may have a big impact on the efficiency of a DC/DC converter, especially at low output load where driver dynamic losses influence significantly the total power losses.

Thus, the embodiment shown in FIG. 10 may have the following advantages: a double NMOS structure may be used, which, with respect to a PMOS and NMOS implementation (see FIG. 4), permits to optimize area and performance of the device, both in terms of switch-on resistance $R_{ON}$ and with respect to switching losses; slew-rate controlled transition of the switching node Lx node may be implemented for both power FETs S1 and S2; the solution may be used in all operating condition of an electronic converter (CCM/DCM/PSM) and with both positive and negative voltages; and the value of the resistor R1 and R2 for controlling the slew rate may be selected during design phase or during testing phase or also during normal operation of the device.

Of course, without prejudice to the principle of the invention, the details of construction and the embodiments may vary widely with respect to what has been described and illustrated herein purely by way of example, without thereby departing from the scope of the present invention, as defined by the ensuing claims.

For example, while the present solution has been described mainly in the context of an inverting buck-boost converter, the same driving may be applied also to other circuits comprising a half-bridge or full-bridge architecture. For example, in the context of a full-bridge the terminal 200b/202b may correspond to the intermediate node/switching node of a further half-bridge comprising two electronic switches.

The claims form an integral part of the technical teaching of the description provided herein.

The invention claimed is:

1. A circuit, comprising:
   a first terminal, a second terminal, and a third terminal, wherein a voltage at said third terminal represents a reference voltage;
   a half-bridge comprising a first n-channel FET and a second n-channel FET connected in series between said first terminal and said second terminal, wherein a first intermediate node between said first n-channel FET and said second n-channel FET represents a switching node;
   a first driver circuit configured to drive a gate terminal of said first n-channel FET as a function of a first drive signal;
   a second driver circuit configured to drive a gate terminal of said second n-channel FET as a function of a second drive signal;
   a voltage regulator configured to generate a first supply voltage at an output terminal as a function of a voltage between said first terminal and said second terminal, wherein said first supply voltage is used to supply said second driver circuit;
   wherein said first driver circuit is a driver circuit without slew-rate control configured to set an output node of said first driver circuit to said reference voltage or to a second supply voltage as a function of said first drive signal;
   a slew-rate circuit, comprising:
   a first resistor and a capacitor connected in series between said output node of said first driver circuit and a second intermediate node;

a first electronic switch having a first conduction path connected between said second intermediate node and said first terminal;

a second electronic switch having a second conduction path connected between said second intermediate node and said gate terminal of said first n-channel FET; and a second resistor and a third conduction path of a third electronic switch connected in series between said gate terminal of said first n-channel FET and said switching node; and a control circuit configured to:

for a first time interval, set said first drive signal and said second drive signal to close said first n-channel FET and to open said second n-channel FET, respectively, and set a first control signal, a second control signal and a third control signal to simultaneously open said first electronic switch, open said third electronic switch and close said second electronic switch, respectively; and for a second time interval, set said first drive signal and said second drive signal to open said first n-channel FET and close said second n-channel FET, respectively, and set said first control signal, said second control signal and said third control signal to simultaneously close said first electronic switch, close said third electronic switch and open said second electronic switch, respectively.

2. The circuit according to claim 1, further comprising an inductance connected between said switching node and said third terminal.

3. The circuit according to claim 2, wherein said circuit is an inverting buck-boost converter, said first terminal and said third terminal are configured to receive an input voltage and said second terminal and said third terminal are configured to provide an output voltage.

4. The circuit according to claim 3, wherein the inverting buck-boost converter is operated in a discontinuous conduction mode or a pulse skip mode.

5. The circuit according to claim 2, wherein said circuit is a buck converter, wherein said first terminal and said second terminal are configured to receive an input voltage and said third terminal and said second terminal are configured to provide an output voltage.

6. The circuit according to claim 5, wherein the buck converter is operated in a discontinuous conduction mode or a pulse skip mode.

7. The circuit according to claim 1, wherein said control circuit is further configured to: for a third time interval, set said first drive signal and said second drive signal to open both said first n-channel FET and said second n-channel FET, respectively, and set said first control signal, said second control signal and said third control signal to close said first electronic switch and said third electronic switch and open said second electronic switch, respectively.

8. The circuit according to claim 1, wherein said second driver circuit is configured to generate a charge current at the gate terminal of said second n-channel FET as a function of said second drive signal, thereby charging a gate-source capacitance of said second n-channel FET to one of:

said first supply voltage, thereby closing said second n-channel FET; or a voltage at said second terminal, thereby opening said second n-channel FET.

9. The circuit according to claim 1, wherein said first driver circuit comprises:

a further half-bridge comprising two electronic switches connected between said second supply voltage and said reference voltage, wherein a third intermediate node between said two electronic switches represents said output node of said first driver circuit; and a further half-bridge driver configured to generate drive signals for controlling said two electronic switches as a function of said first drive signal.

10. The circuit according to claim 1, wherein said first electronic switch is an n-channel FET, said third electronic switch is an n-channel FET, and said second electronic switch is a p-channel FET.

11. The circuit according to claim 1, wherein a capacitance of said capacitor is in a range of 200 pF to 2 nF.

12. The circuit according to claim 1, wherein a resistance of each of said first resistor and said second resistor is in a range between 50-500 Ohms.

* * * * *